United States Patent [19]

Saari

[11] Patent Number: 4,656,436

[45] Date of Patent: Apr. 7, 1987

[54] CMOS TRANSCONDUCTANCE CIRCUIT WITH TRIODE MODE INPUT

[75] Inventor: Veikko R. Saari, Spring Lake Heights, N.J.

[73] Assignee: AT&T Bell Laboratories, Murray Hill, N.J.

[21] Appl. No.: 815,238

[22] Filed: Dec. 31, 1985

[51] Int. Cl.[4] .................... H03F 3/45; H03F 3/16
[52] U.S. Cl. ............................ 330/253; 330/264; 330/277; 330/294; 330/311
[58] Field of Search ............... 330/253, 264, 277, 294, 330/311

[56] References Cited

U.S. PATENT DOCUMENTS

| 4,459,555 | 7/1984 | Jett, Jr. ................... | 330/253 |
| 4,509,019 | 4/1985 | Banu et al. ............... | 330/107 |
| 4,518,870 | 5/1985 | Bano et al. ............... | 307/356 |

OTHER PUBLICATIONS

*IEEE Journal of Solid-State Circuits*, "Fully Integrated Active RC Filters in MOS Technology", M. Banu and Y. Tsividis, vol. sc-18, No. 6, pp. 644-651, Dec. 1983.
*IBM Technical Disclosure Bulletin*, "Complementary FET Differential Amplifier", W. Cordaro, vol. 16, No. 10, Mar. 1974.
*IEEE Journal of Solid-State Circuits*, "Power-Supply Rejection in Differential Switched-Capacitor Filters", Alejandro DE LA Plaza and Patrice Morlon, vol. sc-19, No. 6, pp. 912-918, Dec. 1984.

*Primary Examiner*—James B. Mullins
*Attorney, Agent, or Firm*—Volker R. Ulbrich

[57] ABSTRACT

A transconductance circuit (10) has its signal input terminals (28,40) at the gates of a pairs of MOSFETS (16,22; 32,38) which are forced to operate in the triode mode. The outputs of the triode mode MOSFET pair are fed to a cascode transistor (18,20; 34,36) for treatment as a differential signal. The differential output (30,42) of the cascode transistors is highly linear with respect to the input signal at the gates of the triode mode transistors. Bias voltages for the gates of the cascode transistors are generated by a bias network (14). The transconductance circuit 12 includes a cross-coupled set of compensation capacitors (62, 64; 66, 68) formed from devices with the same geometries as the triode mode transistors to compensate for high frequency loss due to the Miller effect in the input transistors.

9 Claims, 1 Drawing Figure

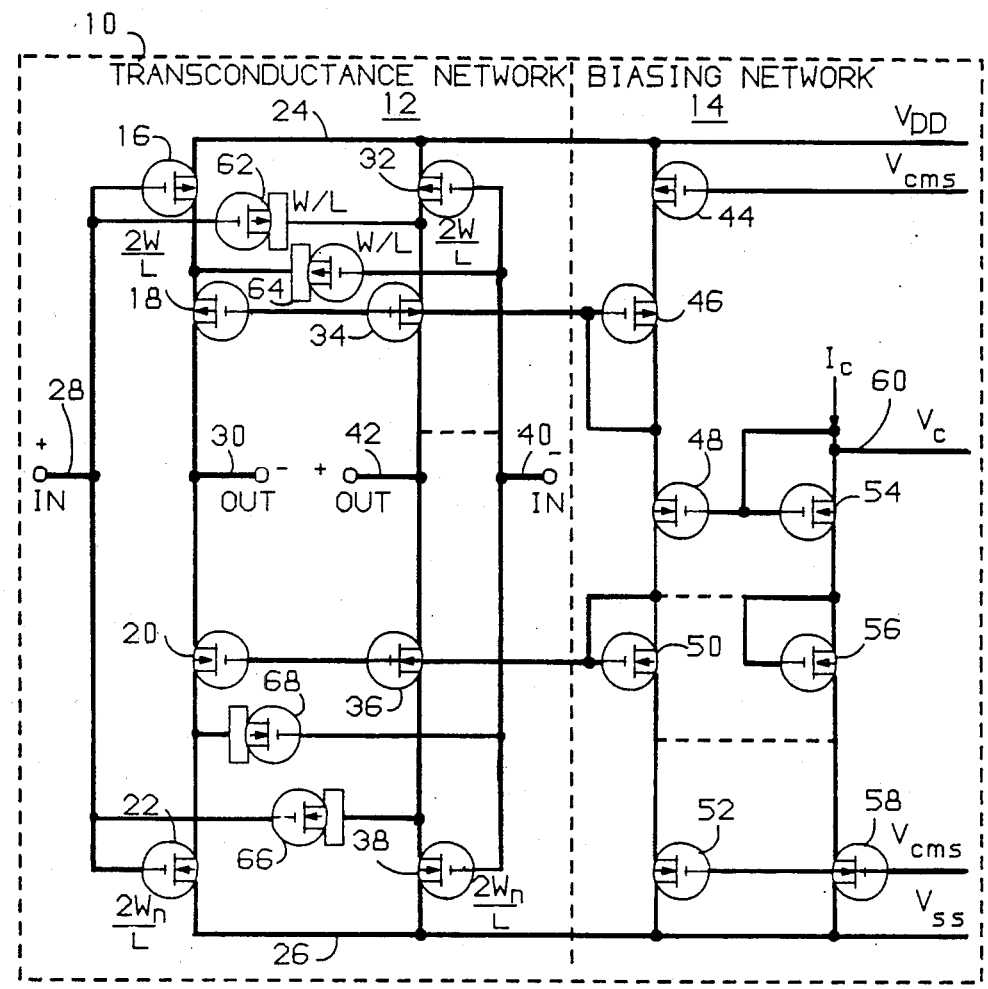

4,656,436

CMOS TRANSCONDUCTANCE CIRCUIT WITH TRIODE MODE INPUT

TECHNICAL FIELD

The invention relates to electronic amplifiers, particularly to transconductance circuits implemented in field-effect transistor technology for precision applications.

BACKGROUND OF THE INVENTION

A transconductance as such performs the function of converting a signal input voltage to a signal output current. While such a function can be performed for some purposes by a single device, such as a single resistor or a MOSFET (metal-oxide-semiconductor field-effect transistor), for applications requiring a monolithic integrated filter circuit with relatively high precision for signals with frequencies above the audible range a more complex transconductance network is generally required in order to avoid or reduce degradations of the output due to non-linearity, phase lag, transistor thermal noise, and noise from other sources, such as the supply voltage nodes. Telecommunications receiving and other equipment often includes an integrated circuit tunable active filter, such as for example a biquad Butterworth filter, which relies upon relatively high precision and broadband transconductance networks that can be controlled continuously by means of an applied voltage or current to set its transfer function. There is a need for such transconductance networks which have a high degree of linearity and low phase shift at relatively high signal frequencies.

SUMMARY OF THE INVENTION

The transconductance network in accordance with the present invention has its signal input port at the gates of a pair of MOSFETs which are forced to operate in the triode mode. The output currents of the triode mode MOSFET pair are fed through cascode transistors for treatment as a differential signal. The differential output of the suitably loaded cascode transistor pair is highly linear with respect to the input signal applied to the gates of the triode transistors. Pairs of triode mode input transistors and their associated cascode transistors can be arranged in complementary configurations to achieve transconductance networks with good common mode suppression which are precise and highly linear as differential networks and low in phase lag, even at above-audio frequencies. The network includes a cross-coupled set of compensation capacitors formed from transistor structures that match the above-mentioned triode mode transistors.

BRIEF DESCRIPTION OF THE DRAWING

The drawing FIGURE is a schematic circuit diagram of a MOSFET transconductance circuit in accordance with one example of the invention in which complementary pairs of triode mode signal input transistors and compensating transistors are connected in a differential circuit configuration having an especially wide input signal voltage range and broad bandwidth. Phase lag is kept low by means of cross-coupled triode mode capacitor transistors that indirectly, but precisely compensate for the high frequency signal loss due to the Miller effect in the other input transistors.

DETAILED DESCRIPTION

The transconductance circuit 10 shown in the drawing FIGURE as one implementation example of the invention has a transconductance network 12 and a biasing network 14. The transconductance network 12 is fully differential and broadband. That is, it receives two input signals such that their difference represents the input signal magnitude, and its output currents likewise constitute a difference signal. All the transistors of the amplifier 10 are MOS (metal-oxide-silicon) semiconductor) devices of the enhancement mode type. The conductivity type, P or N, of a transistor refers to the conductivity type of its conduction channel. Reference to the dimensions of a transistor is to the width W and length L of its conduction channel, which are often given as a ratio W/L. Reference to the connection of a transistor as such is to the connection of its conduction path, the source and drain conduction channel. The circuit 10 is complementary (CMOS), and therefore has both N-type channel conductivity devices, which can be identified in the drawing by a bulk connection arrow pointing toward the control electrode, or gate, and P-type channel conductivity devices, which can be identified by a bulk connection arrow pointing away from the gate. The connections of the bulk regions of the transistors is not shown, since appropriate connections for them would be readily apparent to those skilled in the art.

A first, positive d.c. (direct current) signal branch of the transconductance circuit 12 is formed by a P-type input transistor 16, a P-type cascode transistor 18, an N-type cascode transistor 20, and an N type input transistor 22, all respectively connected in tandem between a positive supply voltage rail 24 with a voltage $V_{DD}$ and a negative supply voltage rail 26 with a voltage $V_{SS}$. The gates of the input transistors 16,22 are connected together at a positive input terminal 28. The common node of the cascode transistors 18,20 is connected to a negative output terminal 30.

A second, negative d.c. signal branch of the transconductance network 12 is formed by a P-type input transistor 32, a P-type cascode transistor 34, an N-type cascode transistor 36, and an N-type input transistor 38, all respectively connected in tandem between the positive supply voltage rail 24 and the negative supply voltage rail 26. The gates of the input transistors 32,38 are connected together at a negative input terminal 40. The common node of the cascode transistors 34,36 is connected to a positive output terminal 42.

The biasing network 14 includes a stack of two P-type transistors 44, 46 and three N-type transistors 48, 50, 52 connected in tandem between the positive supply voltage rail 24 and the negative supply voltage rail 26. The gate of the first transistor 44 is connected to a reference voltage $V_{CMS}$, which is the average of $V_{DD}$ and $V_{SS}$, and is near ground. This feature is important in respect to achieving excellent input common mode and supply rejection in this type of differential structure. The gate of the second transistor 46 is connected to its drain and to both the gates of the P-type cascode transistors 18, 34 of the transconductance network 12. The gate of the fourth transistor 50 is connected to its drain and to the gates of the N-type cascode transistors 20, 36 of the transconductance network 12. The gate of the fifth transistor 52 is connected to the reference voltage $V_{CMS}$, which might be obtained with a simple resistance divider connected between the supply voltage rails 24,26. This biasing arrangement, with the condition that virtually all the current passing through the output nodes is introduced there by signal-carrying transistors produces a relatively low level of differential output noise.

Another stack of three N-type transistors 54, 56, 58 are connected respectively in tandem between a control node 60 and the negative supply voltage rail 26. The gate of the first one, 54 is connected to its drain and to the gate of the transistor 48. The gate of the second one, 56 is connected to its drain, and the gate of the third one is connected to the reference voltage $V_{CMS}$. Optionally, the drains of 50 and 56 can be connected together and-/or the drains of 52 and 58 can be connected together as well.

A P-type pair of compensation capacitor transistors 62 and 64 is connected between the positive and negative signal branches with device dimensions tracking those of transistors 16 and 32, respectively. Transistor 62 has its gate connected to the node 28 and both its drain and its source connected to the common point of transistors 32 and 34. Transistor 64 has its gate connected to the node 40 and its drain and source connected to the common point of transistors 16 and 18. An N-type pair of compensation capacitor transistors 66 and 68 is connected between the positive and negative signal branches with device dimensions tracking those of the trarsistors 22 and 38, respectively. The transistor 66 has its gate connected to the node 28 and both its drain and source connected to the common point of transistors 36 and 38. The transistor 68 has its gate connected to the node 40 and both its drain and source connected to the common point of transistors 20 and 22. The most precise and dependable frequency compensation is achieved when transistors 16 and 32 are each formed of two identical units in parallel, and transistors 62 and 64 each are identical to these units. The sum of the gate-to-source and gate-to-drain capacitances of transistor 62 or 64 precisely compensates for the signal transmission effect of the gate-to-drain capacitance of the similarly biased transistor 16 or 32. Similar considerations apply for the relationships between the N-type transistors 22,66,38, and 68.

In the transconductance network 12, the device dimensions of the transistors 16, 18, 20, and 22 of the positive signal branch are identical to the respective device dimensions of the transistors 32, 34, 36, and 38 of the negative signal branch. The device dimensions of the transistors 44, 46, 50, and 52 of the biasing network are not necessarily identical to, but are respectively proportional to those of the corresponding transistors 32, 34, 36, and 38 of the negative signal branch. Likewise, the device dimensions of the transistors 54, 56, and 58 of the biasing network 14 are respectively proportional to the corresponding transistors 48, 50, and 52.

In the operation of the circuit 10, a control current $I_C$ is forced through the three transistors 54, 56, and 58 of the control branch. Due to the common gate connection of the transistors 48 and 54, and matched condition of the transistor stacks below them, the transistor 48 functions as a current mirror transistor to establish a proportional current in the transistor stack 44,46,48,50,52 of the biasing network 14. The transistors 44, 52, and 58 adjoining the voltage supply rails 24, 26 are forced to operate in the triode mode. The triode mode for an MOS device is that mode of operation which results when there is a drain-source voltage which is lower than the amount by which the gate-to-source voltage exceeds the threshold voltage. In this mode of operation the device exhibits a highly linear output current response over a relatively wide range of gate voltages given that the terminating impedance applied between the drain and source is sufficiently low. The desired drain-source bias voltage is obtained by properly choosing the relative conduction channel resistances of the devices in the control branch, which act essentially as voltage dividers in this regard. That is, the triode mode transistors 44, 52 have low width-to-length ratio conduction channels relative to the cascode transistors 46, 50 respectively associated with them. The common gate connections of the P-type cascode transistors 18, 34, and the diode-connected transistor 46 and the common gate connection of the N-type cascode transistors 20, 36 and the diode-connected transistor 50 establish identical bias currents in the negative and positive signal branches of the transconductance network 12 such that the input transistors 16, 32, 22, and 38 all operate in the triode mode. Their output currents are then transmitted by their respective associated cascode transistors 18, 34, 20, and 36.

Because the input transistors 16, 22, 32, and 38 are operating in the triode mode, the differential response of the circuit 14 to the input signal is highly linear. The input devices are present for their linearity alone, and not for significant gain. Voltage gain may be provided by the cascode transistors associated with them. These at the same time are used to force the input transistors into the triode mode. Since the transistors 50 and 56, as well as 20 and 36 are relatively wide-channel devices, their gate-to-source threshold voltages are only slightly above the threshold voltage, given that the control and bias currents are sufficiently small. Since the transistors 22, 38, 52, and 58 have much larger gate-to-source voltages, the same currents will flow in them only when their transconductances are dropped by entry into the triode mode, that is, when the drain-to-source voltages become low. This is true even though the width-to-length ratios of the triode mode devices are somewhat the smaller. The complementary symmetry of the amplifying network 12 and the application of the supply common mode voltage $V_{CMS}$ as a reference results in very good input common mode signal suppression in the output currents. As is usually the case, output common mode voltage and/or current must be suppressed, too. In the example circuit this is done by connecting the output nodes to the summing nodes of operational amplifiers and also loading these nodes with resistances. Other means of output common mode suppression will occur to persons well versed in the art. In this regard, it is worthwhile to make the conductivities of the N-type transistors approximately the same as those of their P-type counterparts. This implies making the P-type channel width-to-length ratios about 2.5 to 3 times larger to compensate for the difference in mobilities.

The transconductance between the input node 28 and the output node 30 is the sum of the transconductances of the P-type and N-type channel input transistors, reduced somewhat by the loading effect of the associated cascode transistors. At high frequencies, the gate-to-drain capacitances of the input transistors tend to cause the phase angle of the transconductance to drop, due to bypassing of the desired transmission path with a path of opposite sign. This may be precisely compensated for in the differential output current by the provision of transistor capacitors 62 and 66 leading to points in the other output branch. They are preferably in the form of transistors with their drain and source shorted together connected as shown, their gate-to-drain voltages match the gate-to-drain voltages of the transistors being compensated. This compensation arrangement is insensitive to typical variations in the processing parameters of CMOS circuits. Similar arguments hold for the positive output branch.

A convenient way of establishing $V_{CMS}$ is to place a voltage divider formed of equal resistances between the supply voltage nodes 24,26. Common-mode d.c. voltage offset at the output nodes 30, 42 can be limited to a small range about signal ground potential, even when the loads are only capacitances, by the addition of a suitable network to provide resistances of very roughly 1 megohm between these nodes and ground potential, sufficient to handle the effects of the inevitable small imbalance between the P-channel and N-channel parts of the circuit 10.

In a filter circuit where there is a transconductance circuit in tandem with non-ideal integrators, excess phase lag of the integrators can be compensated to a considerable degree by means of small additional capacitors placed between the input nodes 28 and 40 and the in-phase output nodes 42 and 30, respectively. For proper tracking, these additional capacitors should be of the same type as are used in the integrator circuits.

What is claimed is:

1. A field-effect-transistor transconductance differential amplifier, comprising:
    a first signal branch including a first conductivity type input transistor having its source connected to a first polarity supply voltage node and a first conductivity type cascode transistor having its source connected to the drain of the input transistor and its drain forming a first signal output node, the gate of the input transistor forming a first signal input node;
    a second signal branch, coupled through compensation capacitors, but otherwise isolated from the first signal branch, including a first conductivity type input transistor having its source connected to the first polarity supply voltage node and a first conductivity type cascode transistor having its source connected to the drain of the input transistor and its drain forming a second signal output node, the gate of the input transistor forming a second signal input node, the first and second input nodes forming a differential input port;
    bias means for establishing in each of the first and second signal branches a bias current such that the cascode transistor of that branch operates in the saturated mode, while the input transistor to which it is connected operates in the triode mode.

2. The amplifier defined in claim 1 wherein
    the first branch further comprises:
    a second conductivity type, complementary input transistor, having its source connected to a second polarity supply voltage node;
    a second conductivity type, complementary cascode transistor having its source connected to the drain of the complementary input transistor and its drain connected to the first polarity signal output node, the gate of the complementary input transistor being connected to the gate of the first conductivity type input transistor, and
    the second branch further comprises:
    a second conductivity type, complementary input transistor, having its source connected to a second polarity supply voltage node, and a second conductivity type, complementary cascode transistor having its source connected to the drain of the complementary input transistor and its drain connected to the second signal output node, the gate of the complementary input transistor being connected to the gate of the first conductivity type input transistor, and
    bias means for causing the cascode transistors to operate in the saturated mode and the input transistors of the second conductivity type to operate in the triode mode.

3. The amplifier defined in claim 2, wherein the bias means comprises:
    a first bias branch comprising first, second, and third transistors of the first conductivity type and first and second transistors of the second conductivity type connected, respectively, between the first polarity supply voltage and the second polarity supply voltage,
    the gate of the second transistor of the second conductivity type being connected to a reference voltage,
    the gate of the first transistor of the second conductivity type being connected to its drain and to the gates of the complementary cascode transistors of the first and second signal branches,
    the gate of the third transistor of the first conductivity type being connected to a control voltage node equal to the mean of the first and second supply voltages,
    the gate of the second transistor of the first conductivity type being connected to its drain and to the gates of the cascode transistors of the first and second signal branches, and
    the gate of the first transistor of the first conductivity type being connected to the reference voltage.

4. The amplifier defined in claim 3, wherein the bias means further comprises a second bias branch, comprising:
    first, second, and third transistors of the first conductivity type connected in series, respectively between first polarity supply voltage node and the the control voltage node,
    the gate of the first transistor being connected to the reference voltage,
    the gate of the second transistor being connected to its source, and
    the gate of the third transistor being connected to its drain and to the gate of the third transistor of the first conductivity type of the first bias branch.

5. The amplifier defined in claim 4 wherein in each of the signal branches and the bias branches the transistors operate in the same mode as, and have device dimensions which are matched to those of the transistors in all the other branches which correspond to the same numerical device location with respect to one of the supply voltage nodes.

6. A field-effect transistor differential transconductance circuit having first and second polarity signal branches, each branch comprising:
    a first conductivity type input transistor and a first conductivity type cascode transistor respectively connected in tandem between a first polarity voltage supply node and an output node, and
    a second conductivity type input transistor and a second conductivity type cascode transistor respectively connected in tandem between a second polarity voltage supply node and the output node, the gates of the input transistors being connected together to form an input node, the geometries of all the transistors and the gate bias voltages of the cascode transistors of the branch being chosen to force the input transistors to operate in the triode mode, and biasing means for generating equal bias voltages at the gates of the like conductivity type cascode transistors of the branches.

7. The circuit defined in claim 6 comprising:

a first conductivity type compensation transistor having its gate connected to the input node of the first branch and its source and drain connected to the output node of the second branch through the conduction channel of a first cascode transistor;

a first conductivity type compensation transistor having its gate connected to the input node of the second branch and its source and drain connected to the output node of the first branch through the conduction channel of a first cascode transistor;

a second conductivity type compensation transistor having its gate connected to the input node of the first branch and its source and drain connected to the output node of the second branch through the conduction channel of a second cascode transistor;

a second conductivity type compensation transistor having its gate connected to the input node of the second branch and its gate and source connected to the output node of the first branch through the conduction channel of a second cascode transistor.

8. The circuit defined in claim 7 wherein the first conductivity type compensation transistors have like device dimensions and the second conductivity type compensation transistors have like device dimensions.

9. The circuit defined in claim 8 wherein the width-to-length device dimension ratio of the first conductivity type compensation transistors is one-half that of the first conductivity type input transistors and the width-to-length device dimension ratio of the second conductivity type compensation transistors is one-half that of the second conductivity type input transistors.

* * * * *